United States Patent [19]

Chiang

[11] Patent Number: 4,998,183

[45] Date of Patent: Mar. 5, 1991

[54] DATA TRANSFER SWITCH BOX

[76] Inventor: Peter Chiang, 5th Floor, No. 438, Neihu Road, Section 2, Neihu, Taipei, Taiwan

[21] Appl. No.: 333,674

[22] Filed: Apr. 6, 1989

[51] Int. Cl.[5] .............................. H05K 00/00

[52] U.S. Cl. .............................. 361/395; 200/5 R; 200/292; 361/426; 439/76

[58] Field of Search .............................. 439/68, 70, 76, 78; 200/5 R, 5 A, 292; 361/380, 395, 399, 400, 405, 412, 413, 426, 397, 356, 357

[56] References Cited

U.S. PATENT DOCUMENTS 4,532,575 6/1985 Suwa .............................. 361/413

4,737,888 4/1988 Bodnar .............................. 361/427

*Primary Examiner*—Gerald P. Tolin

*Attorney, Agent, or Firm*—Lowe, Price, LeBlanc, Becker & Shur

[57] ABSTRACT

This invention relates to an improved construction of a computer switch box, and, in particular comprises a data switch box which controls the switching of input and output signals of the data in a main frame. The improved construction of the interior structural body includes a combination of a circuit board, an input terminal seat, multiple sockets, an assembly of a plurality of pins arranged in rows, and multiple output terminal seats. By separately inserting an assembly of multiple pins arranged in rows into multiple corresponding sockets, the electric current is conducted through each of the input and output points, which will have been previously determined.

3 Claims, 6 Drawing Sheets

DATA TRANSFER SWITCH BOX

DETAILED DESCRIPTION OF THE INVENTION

A conventional computer switch box comprises an input terminal seat, two output terminal seats, six sliding switches and a circuit board. Each sliding switch consists of three connecting points. The usual total of eighteen connection points can, therefore, only transmit an electric current through six pairs of input and output points. An output terminal seat must usually transmit an electric current through more than ten pairs, sometimes through dozens of pairs, of input and output points simultaneously, the number of sliding switches required must often be increased. However, a sliding switch is not only large in size, but it is also difficult to fabricate because of the large number of connecting points it contains. When the number of pairs of connecting points being used happens to be odd, and an additional sliding switch is needed, it is necessary to change the integral structure of the switch box. Therefore, it is impossible for a conventional computer switch box to be configured to the requirements of various specifications without making any modifications thereto. This defect not only raises the cost of production of such a switch box, but also weakens its competitiveness in the market.

Focusing on the aforementioned defects, this invention aims to provide reasonable improvements which render the product lighter and shorter, reduce its production cost and simplify its manufacturing process. By means of a terminal at the bottom part of the socket, the input and output points are separately interconnected and an electric current is transmitted through them by inserting an assembly, consisting of a plurality of pins arranged in rows, into the socket (i.e., SWITCH ON). By using the force of a spring to pull out the assembly of pins when the spring is released, the electric current is cut off (i.e., SWITCH OFF). In this way, an assembly of pins arranged in rows and a socket terminal can be assembled according to the number of pairs required on the output terminal seat. Therefore, the assemblies of numerous pins arranged in rows and the sockets used in this invention will be able to substitute for numerous sliding switches, and the number of connecting points can also be decreased to as little as one third, so as to simplify the fabrication of this computer switch box.

A primary object of this invention is to improve the construction of a computer switch box which is also small in size, easily fabricated and comprised of fewer connecting points.

Another object of this invention is to improve the construction of a computer switch box which facilitates the selection of the proper number of assemblies of plural pins, arranged in rows and sockets, to be used so that the number of assemblies is equal to the number of connecting points required for the output terminal seats, so as to reduce the cost of production of the switch box.

Still another object of this invention is to provide a computer switch box which enables the installation, at will, of a plurality of output terminal seats for separate and independent usage without occupying any extra space.

Other objects, features and effects of this invention will be further explained herein with reference to the related drawings which are set below:

Figure 1:
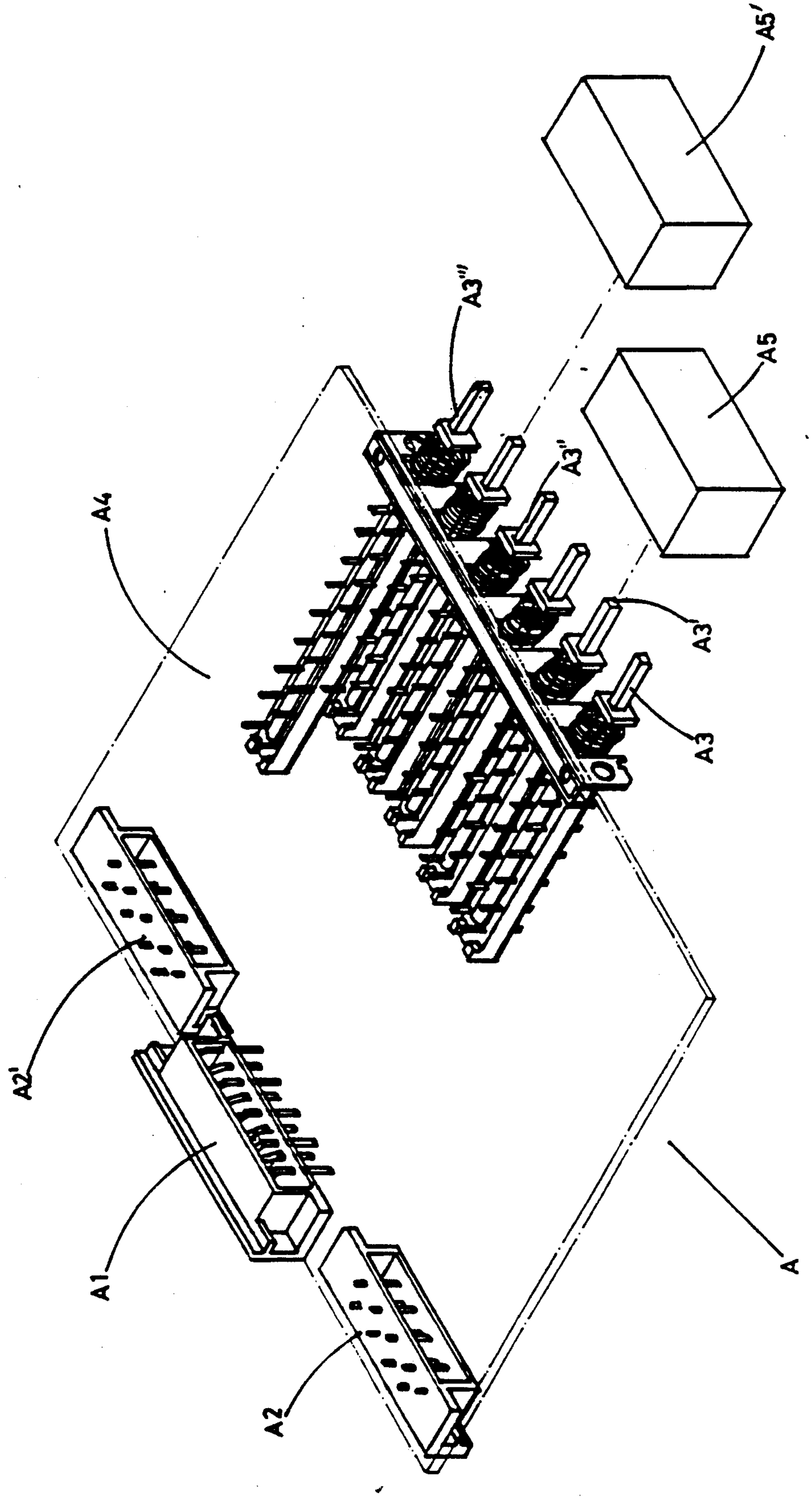
FIG. 1 PRIOR ART
FIG. 1 is a drawing illustrating the interior of a conventional computer switch box.
Figure 2:
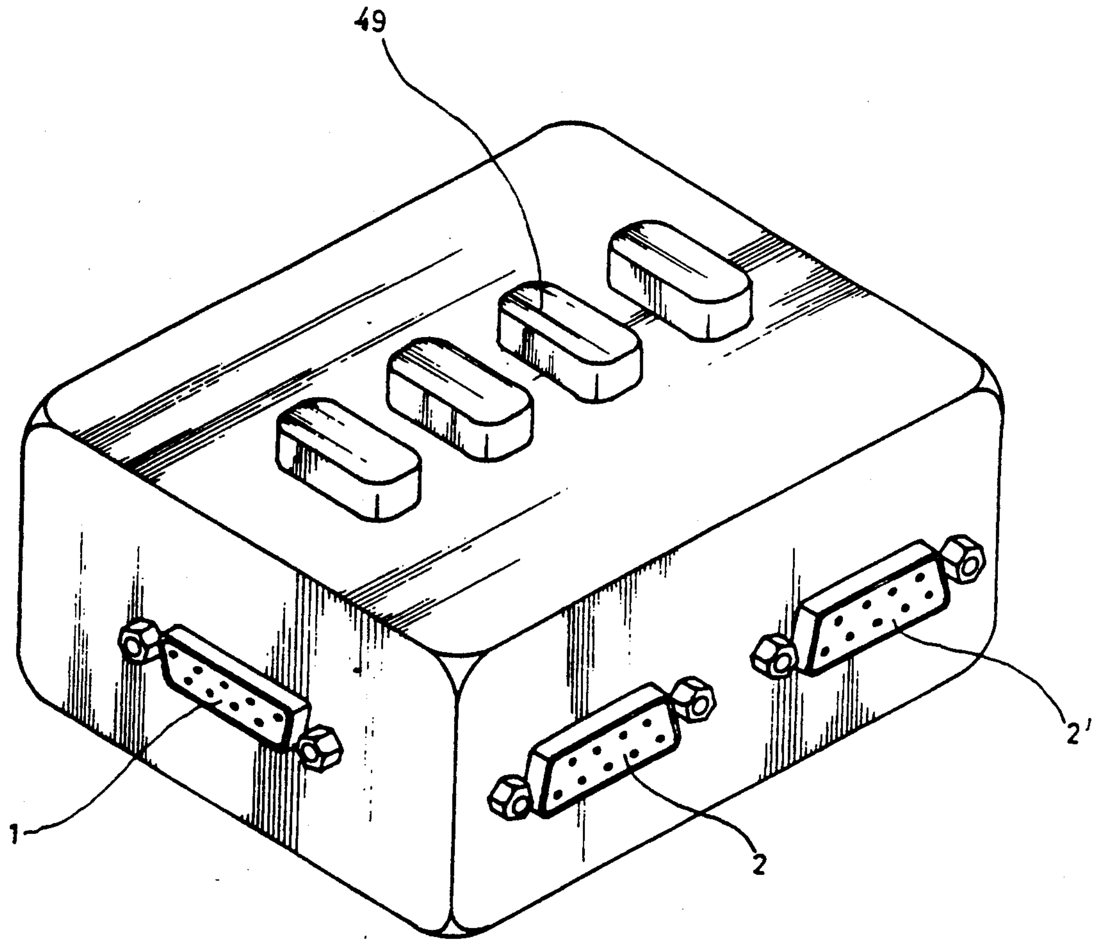
FIG. 2 is a drawing illustrating the outer surfaces of a computer switch box according to this invention.
Figure 3:
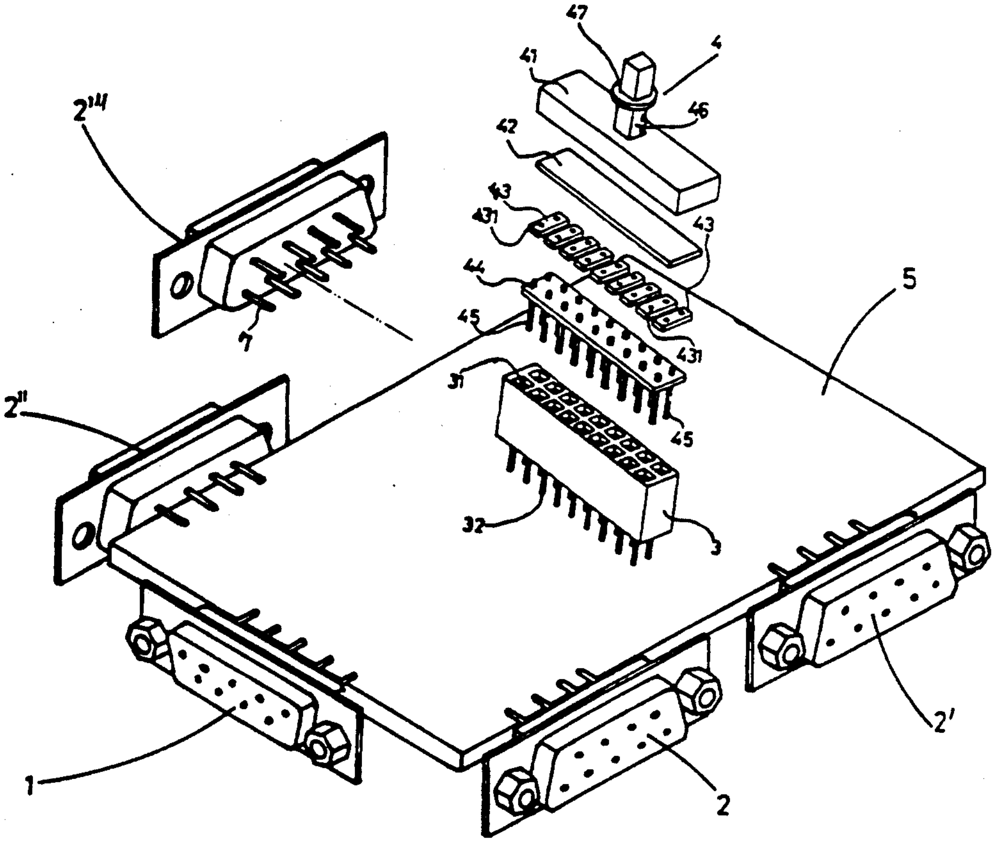
FIG. 3 is a drawing illustrating the interior elements of a computer switch box according to the invention.

As illustrated in FIG. 1, it can be seen that the internal structure of a conventional computer switch box (A) consists of an input terminal seat (Al), two output terminal seats (A2, A2′), a plurality of sliding switches (A3, A3′, A3″, A3‴), a circuit board (A4) and other major component parts. Due to the fact that the sliding switches (A3, A3′, A3″, A3‴) are of a fixed specification, in which every three connecting feet form one unit, a sliding switch will have 18 connecting feet, which can transmit an electric current through only 6 input and output points. As each terminal output seat (A2, A2′) will usually have to transmit the electric current simultaneously through more than ten, or even through dozens of input and output points, a plurality of sliding switches (A3, A3′, A3″, A3‴) will be required for each terminal output seat (A2, A2′). Therefore, a large size button (A5, A5′) must be installed on the exterior of the shell body, so that the plurality of sliding switches (A3, A3′, A3″, A3‴) can be operated at the same time. Because its input terminal seat (Al) and two output terminal seats (A2, A2′) are located on the upper and lower surfaces of the circuit board (A4), the space which is occupied by these aforementioned seats will be quite large. In addition, a large number of connecting points must be welded, making fabrication more complicated. If it is desired to use an output terminal seat (A2, A2′) in which the number of pairs of connecting feet does not coincide with the number of connecting feet on the sliding switch (A3), an additional sliding switch (A3′) will have to be installed. Furthermore, all the related installations, including the large size button, will also have to be re-fabricated. As the production cost of a sliding switch (A3) is usually quite high, it is, therefore, wasteful to use only some of the connecting feet (A3l).

On the other hand, as illustrated in FIGS. 2 through 6, it can be seen that the current invention relates to the improved structure of a computer switch box comprising an input terminal seat (1), a plurality of output terminal seats (2, 2′, 2″, 2‴), a plurality of sockets (3, 3′, 3″, 3‴), a plurality of pin assemblies (4, 4′, 4″, 4‴) having pins arranged in rows, a circuit board (5) and other major components. The input terminal seat (1) is tightly fixed to one side of the circuit board (5) while the output terminal seats (2, 2′, 2″, 2‴) are separately fixed to the lateral sides of the circuit board. The terminals (7) of the input/output terminal seats (1, 2, 2′, 2″, 2‴) are separately set at the lateral side of the circuit board (5). The number of sockets (3, 3′, 3″, 3‴) separately fixed to the upper surface of the circuit board (5) will depend on the number of connecting points required by the output terminal seats (2, 2′, 2″, 2‴). That is to say, a socket (3) can conduct the electric current through an output terminal seat (2). An assembly of pins arranged in rows (4, 4', 4'', 4''') is affixed to the upper surface of each socket (3, 3', 3'', 3''').

Figure 4:
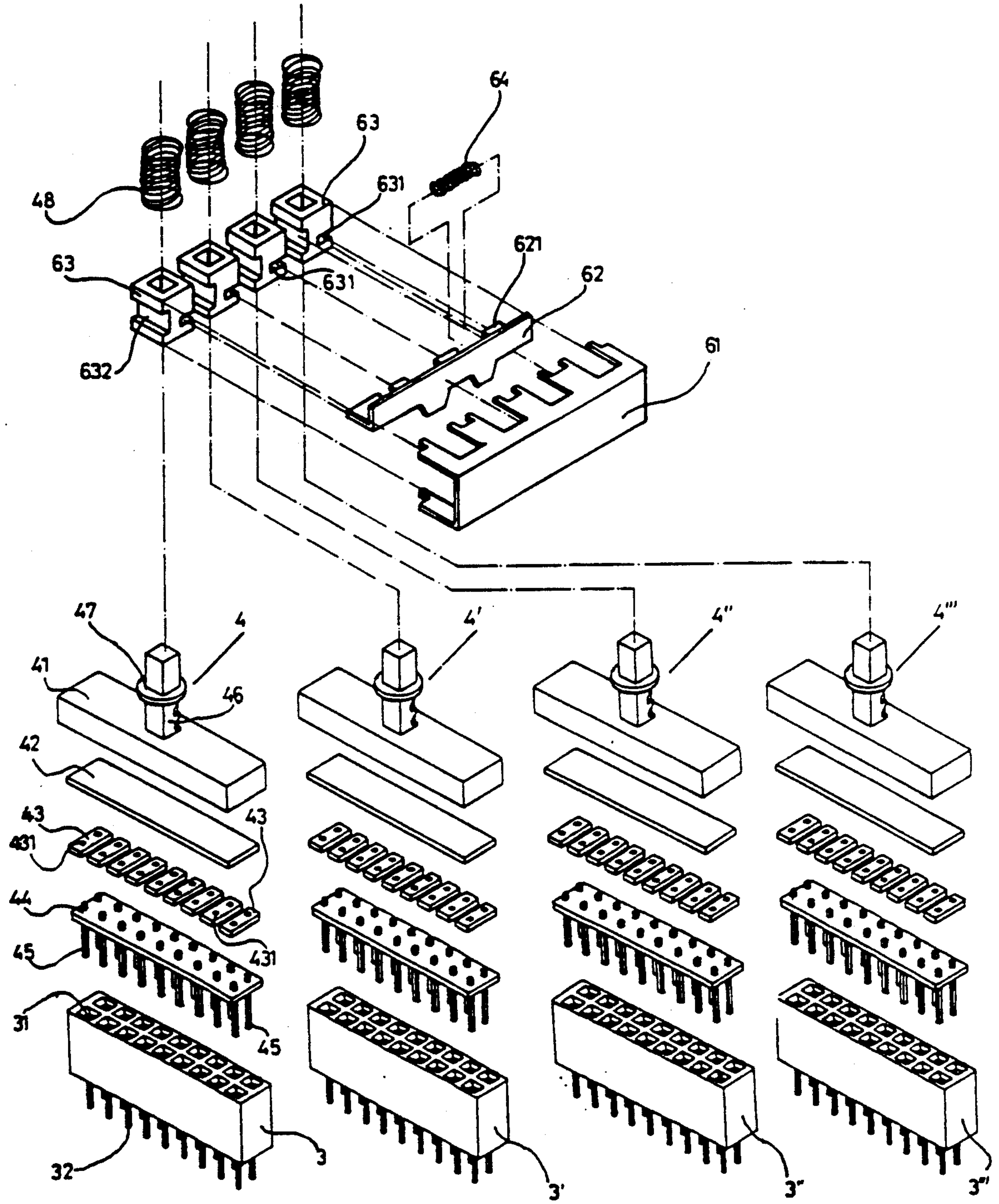
FIG. 4 is a segmented drawing of a number of sockets and assemblies of plural pins arranged in rows in accordance with this invention.
Figure 5:
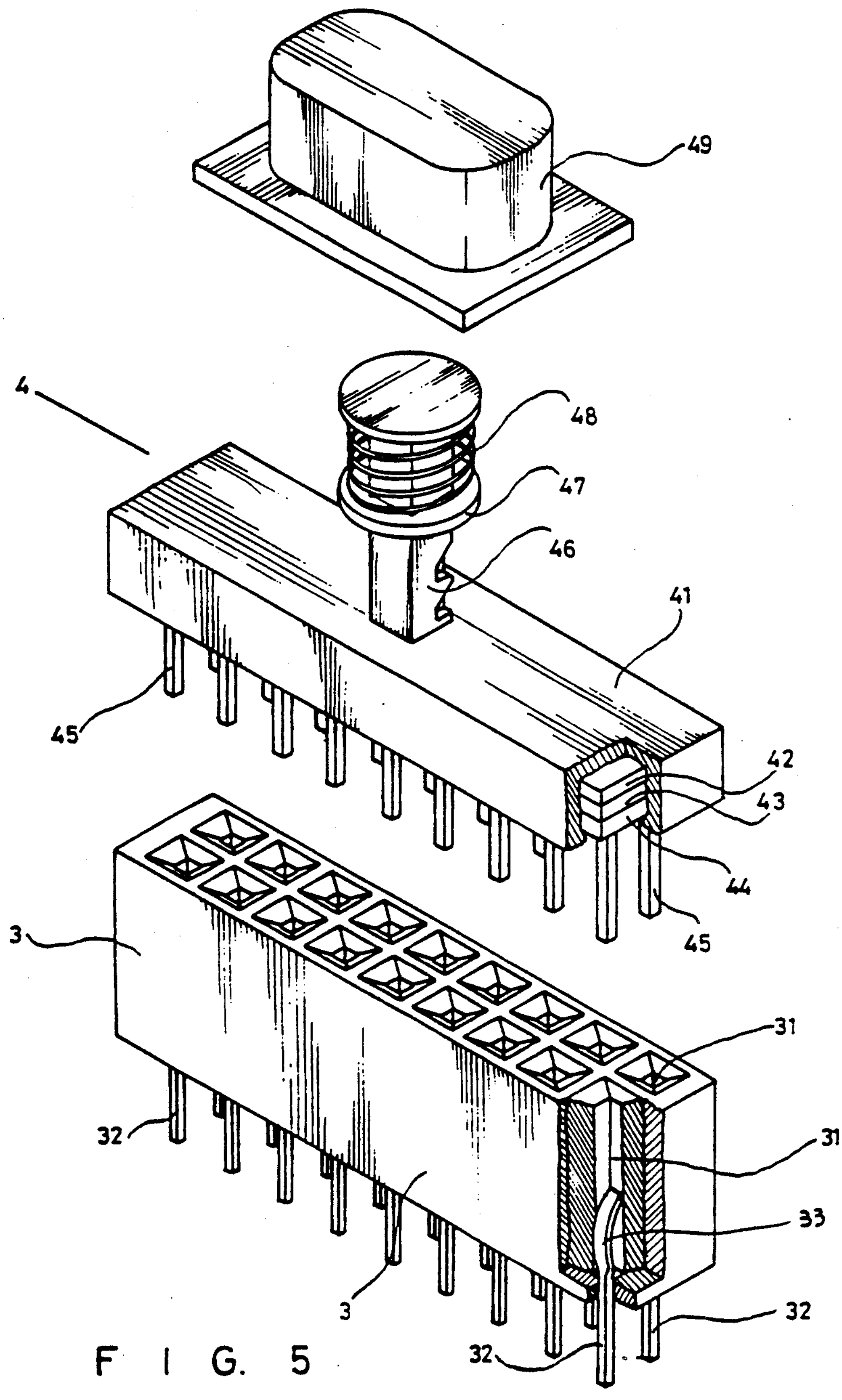
FIG. 5 is a segmented view, partially in perspective, representing an assembly of plural pins arranged in rows in accordance with the invention.
Figure 6:
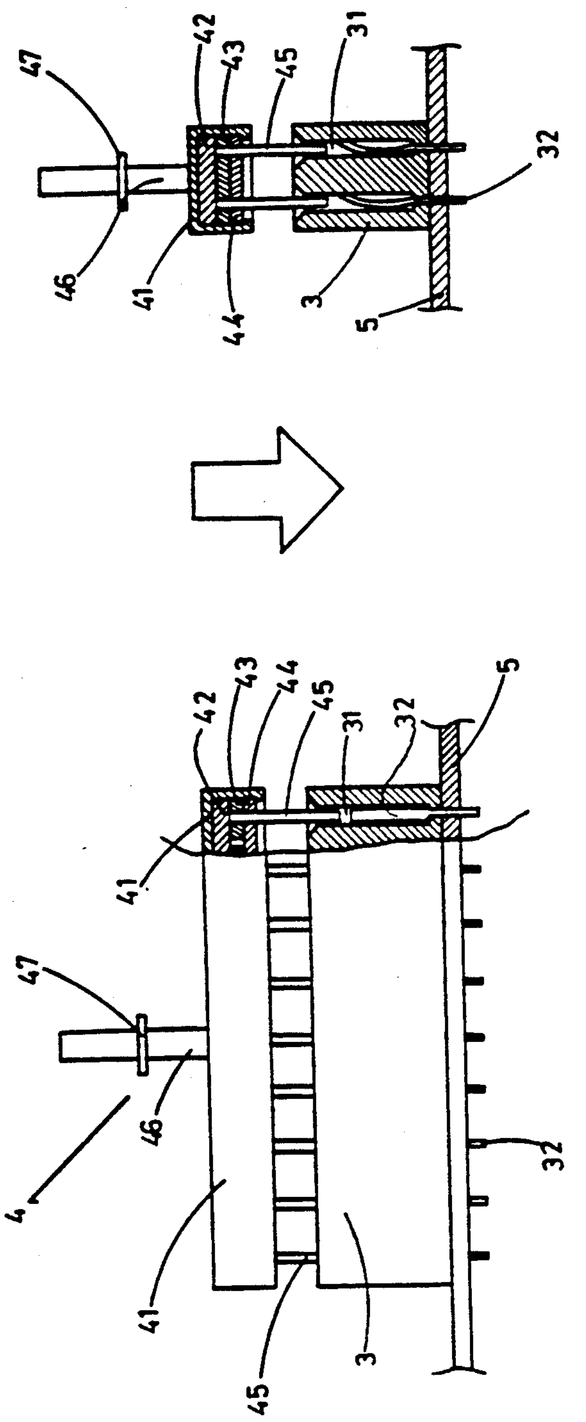
FIG. 6 is a drawing which indicates the pin socket details of the inventive structure.

Please refer to FIGS. 4 and 5 from which it can be seen that the sockets (3, 3', 3'', 3'''), each of which is rectangular in shape, include a plurality of groove holes (31) lined up side by side. In each of the lower portions of the groove holes (31) there is fixed a terminal (32) with a spring piece (33) at its upper end. By means of these terminals (32) possessing spring pieces, the socket can be welded, or otherwise connected, to an appropriate place on the upper surface of the circuit board (5). As shown, each of the assemblies of pins arranged in rows (4, 4', 4'', 4''') is similar in shape to the shape of the socket (3), each assembly having an outer shell (41) in which there is an insulated damper (42). A plurality of conductive pieces (43) are fixed to the lower portion of the damper (42). Each of these conductive pieces has two holes through which the pins arranged in rows (45) can pass. These pins are fixed in corresponding pairs inside a fixed plate (44), are housed in the interior of the outer shell (41) and stopped by a convex block at the lower edge of the outer shell (41). A control lever (46) is set near the center of the upper surface of the outer shell (41). The control lever (46) is inserted into a control block (63) in the upper portion of which is set a convex piece 47 with a spring (48) and a button (49). All the control blocks (63) are fixed in the interior of the fixed iron piece (61) and each of their lateral sides is separately squeezed by a sliding piece (62) which engages into preset groove holes (631). A spring (64) is also placed in a concave groove (632) on the other side of the control block (63). The other end of the spring (64) attaches to the edge of a bending wing (621) of the sliding block (62).

The rows of pins (45) in the assembly (4) are arranged so as to face the multiple groove holes (31) located in the upper portion of the socket (3). When the button (49) is depressed, it exerts pressure on the spring (48). As a result, the control lever (46) moves downward. As well, the sliding piece (62) moves to the left and right. The pins (45) are inserted into the multiple groove holes (31) in the upper portion of the socket (3), thus separately contacting and transmitting the electric current through the terminal (32) which has a spring piece on the lower portion of the groove hole (31). After the electric current has been transmitted through the terminal, the sliding piece (62) squeezes the control lever (46), thus preventing the assembly of pins arranged in rows from springing upward. When another button is depressed, the movement of the sliding piece (62) causes the front spring (48) to release, so as to cause the pins (45) to be disconnected from the springs on the terminals (32) located in the groove holes (31) in the upper portion of the sockets (3), so as also to switch off the electric current. In order to avoid unnecessary errors, the pins (45) will not leave the groove holes (31) of the sockets (3) after the assemblies of the pins arranged in rows have been released. (Please refer to FIG. 6).

While generally keeping the size of the invention constant, the number of sockets (3) and the size of the assemblies of pins arranged in rows (4) can be varied, with every set of sockets (3) and assembly of pins arranged in rows (4) able to transmit the electric current through an output terminal seat (2, 2', 2'', 2'''). In case more pairs of connecting feet terminal seats are required for a specific application, the number of sockets (3) and pins (45) in the assembly (4) can be adjusted without making other modifications or molding. At the same time, this invention enables the number of output terminal seats (2, 2', 2'', 2''') to be selected separately, thus increasing the invention's area of application.

In fabricating this invention, the bottom part of the input terminal seat (1) and the output terminal seats (2, 2', 2'', 2''') are first clamped onto an appropriate place on the periphery of the circuit board (5), and the terminals (32) at the lower end of the multiple sockets (3, 3', 3'', 3''') are then separately inserted into the preset grooves near the center of the circuit board (5) before welding. The assemblies of pins arranged in rows (4, 4', 4'', 4''') are fixed in an appropriate place in the interior of the outer shell of the computer switch box by fixed iron piece (61). When the button (49) is depressed, the rows of pins (45) contact the terminals (32) which have springing pieces and are set beforehand in the lower portion of the socket (3). When the assemblies of pins arranged in rows (4) are released, the pins (45) will still remain inside the qroove holes (31) in the upper portion of the socket (3), although these pins will have already been disconnected from the terminals (32).

Summarizing the above description, it can be seen that the improved computer switch box construction presented by this invention not only proves to be more practical than a conventional computer switch box, but is also found to simplify its fabrication process, reduce its production cost, and to be suitable for application to input/output terminal seats of any specification. Moreover, its dimension can be diminished to facilitate transportation, and multiple output terminal seats can be used in the computer switch box. Therefore, it is concluded that this invention is unique in its practicality.

I claim:

1. In a computer switch box having an input terminal seat, a plurality of output terminal seat as, a plurality of socket assemblies, and a circuit board on which are mounted the plurality of socket assemblies, the improvement comprising said input and output terminal seats including clamping means protruding from bottom portions thereof which clamp said input terminal seat and said plurality of output terminal seats to locations along a periphery of said circuit board;

said plurality of socket assemblies each including a plurality of terminal means protruding from a lower end thereof which extend into a plurality of groove holes, said groove holes preset near a center of said circuit board;

plural pin assemblies each having pins assembled in rows, and said pin assemblies connected to said socket assemblies;

a plurality of fixed iron pieces contacting and connecting the pin assemblies and located within an interior of said computer switch box; and wherein each of said plurality of pin assemblies is shaped similarly to a socket assembly and includes an outer shell, an insulated damper installed in said outer shell, a plurality of conductive pieces set in a lower portion of said damper, said conductive pieces including a pair of holes pierced by said pins.

2. An improved computer switch box as recited in claim 1 wherein said socket assemblies each comprise a rectangular body having a plurality of grooved socket holes arranged side by side and wherein a terminal having a spring portion affixed to an upper portion thereof is fixed to a lower portion of each of said grooved socket holes; said terminals providing means connecting said socket assemblies to predetermined positions along an upper portion of said circuit board.

3. An improved computer switch box as recited in claim 2 further including a plurality of control blocks, said pins fixed in opposing pairs so that two pairs face another two pairs, convex blocks provided at a lower edge of said outer shell for squeezing against said pins;

a control lever set adjacent a central part of an upper portion of said conductive piece;

said control lever inserted into a control block having a convex piece attached to an upper portion thereof by a spring and button;

said control blocks being fixed in the interior of a corresponding one of said fixed iron pieces;

a sliding block separately squeezed by one of the lateral sides of said control blocks against an interior of a groove hole previously set in said control block; and a spring located in a concave groove at an opposite lateral side of said control block while the other end of said spring is housed in a bending wing edge of said sliding block.

* * * * *

UNITED STATES PATENT AND TRADEMARK OFFICE

CERTIFICATE OF CORRECTION

PATENT NO. : 4,998,183

DATED : March 5, 1991

INVENTOR(S) : Peter CHIANG

It is certified that error appears in the above-identified patent and that said Letters Patent is hereby corrected as shown below:

Title page, item [76] Inventor, lines 2 and 3

"Neihu Road, Section 2, Neihu
Taipei, Taiwan"

replace by

--Cheng Kung Road, Section 2, Neihu District
Taipei, Taiwan, R.O.C.--

Signed and Sealed this

Ninth Day of February, 1993

*Attest:*

STEPHEN G. KUNIN

*Attesting Officer*

*Acting Commissioner of Patents and Trademarks*